(12) United States Patent
Kurmaev et al.

(10) Patent No.: US 10,892,848 B2
(45) Date of Patent: Jan. 12, 2021

(54) DEVICES AND METHODS IMPLEMENTING POLAR CODES

(71) Applicant: Huawei Technologies Co., Ltd., Shenzhen (CN)

(72) Inventors: Oleg Feat'evich Kurmaev, Moscow (RU); Alexey Mikhailovich Razinkin, Moscow (RU); Vasily Stanislavovich Usatyuk, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 22 days.

(21) Appl. No.: 16/185,375

(22) Filed: Nov. 9, 2018

(65) Prior Publication Data

US 2019/0081731 A1 Mar. 14, 2019

Related U.S. Application Data

(63) Continuation of application No. PCT/RU2016/000285, filed on May 12, 2016.

(51) Int. Cl.
*H04L 1/00* (2006.01)
*H03M 13/29* (2006.01)
(Continued)

(52) U.S. Cl.
CPC ........ *H04L 1/0057* (2013.01); *H03M 13/033* (2013.01); *H03M 13/13* (2013.01);
(Continued)

(58) Field of Classification Search
CPC ... H04L 1/0057; H03M 13/13; H03M 13/033; H03M 13/2906; H03M 13/616; H03M 13/152
See application file for complete search history.

(56) References Cited

U.S. PATENT DOCUMENTS

2013/0117344 A1* 5/2013 Gross .............. G06F 17/10
708/490
2013/0283116 A1* 10/2013 Arikan ............... H03M 13/13
714/752
(Continued)

FOREIGN PATENT DOCUMENTS

CN 104539393 A 4/2015
CN 105141322 A 12/2015
(Continued)

OTHER PUBLICATIONS

Trifonov et al., "Polar Subcodes," IEEE Journal on Selected Areas in Communications, vol. 34, No. 2, Institute of Electrical and Electronics Engineers, New York, New York (Feb. 2016).
(Continued)

*Primary Examiner* — Thien Nguyen
(74) *Attorney, Agent, or Firm* — Leydig, Voit & Mayer, Ltd.

(57) ABSTRACT

The disclosure relates to devices and methods implementing polar codes. For instance, the disclosure relates to an an encoder for encoding data, wherein the encoder comprises a processor configured to encode the data using a (n, k, d) parent polar code C into codewords $c_0^{n-1} = u_0^{n-1} A$ subject to the constraints $u_0^{n-1} V^T = 0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself and wherein the constraint matrix V comprises in addition to the constraint matrix $V_0$ of the
(Continued)

parent polar code the constraint matrix $V_1$ of a first helper code $C_1$ and the constraint matrix $V_2$ of a second helper code $C_2$.

16 Claims, 7 Drawing Sheets

(51) Int. Cl.
   *H03M 13/03* (2006.01)
   *H03M 13/13* (2006.01)
   *H03M 13/15* (2006.01)
   *H03M 13/00* (2006.01)

(52) U.S. Cl.
   CPC ..... *H03M 13/152* (2013.01); *H03M 13/2906* (2013.01); *H03M 13/616* (2013.01)

(56) References Cited

U.S. PATENT DOCUMENTS

| | | | |
|---|---|---|---|
| 2015/0194987 A1 | 7/2015 | Li et al. | |
| 2015/0244497 A1 | 8/2015 | Arikan | |
| 2015/0295593 A1 | 10/2015 | Trifonov et al. | |
| 2015/0333775 A1* | 11/2015 | Korb | H03M 13/45 714/780 |
| 2015/0349922 A1* | 12/2015 | Arikan | H03M 13/13 714/776 |
| 2016/0013887 A1* | 1/2016 | Shen | H04L 1/0041 375/295 |
| 2016/0056843 A1* | 2/2016 | Gross | G06F 17/10 714/781 |
| 2017/0214416 A1* | 7/2017 | Ge | H03M 13/13 |
| 2017/0257186 A1* | 9/2017 | Ge | H04L 1/0061 |

FOREIGN PATENT DOCUMENTS

| | | |
|---|---|---|
| CN | 105811998 A | 7/2016 |
| EP | 2849377 A1 | 3/2015 |
| KR | 20150106270 A | 9/2015 |

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, Institute of Electrical and Electronics Engineers, New York, New York (Jul. 2009).

Trifonov, "Efficient Design and Decoding of Polar Codes," IEEE Transactions on Communications, vol. 60, No. 11, Institute of Electrical and Electronics Engineers, New York, New York (Nov. 2012).

Tal et al., "How to Construct Polar Codes," IEEE Transactions on Information Theory, vol. 59, No. 10, Institute of Electrical and Electronics Engineers, New York, New York (Oct. 2013).

Miloslavskaya et al., "Sequential Decoding of Polar Codes," IEEE Communications Letters, vol. 18, No. 7, Institute of Electrical and Electronics Engineers, New York, New York (Jul. 2014).

* cited by examiner

| Code (n, k, d) | Size of an explicit specification, bytes | Compact specification size, bytes |
|---|---|---|
| (4096, 3500, 64) | 191587 | 304 |
| (8192, 7000, 100) | 586746 | 518 |
| (16384, 14000, 128) | 1414869 | 583 |
| (65536, 57000, 256) | 854111 | 1765 |
| (4096, 2048, 48) | 20507 | 189 |
| (8192, 4096, 64) | 38071 | 251 |
| (16384, 8192, 96) | 97719 | 454 |
| (32768, 16384, 128) | 211598 | 709 |
| (65536, 32768, 192) | 475486 | 1181 |

Fig. 7

DEVICES AND METHODS IMPLEMENTING POLAR CODES

CROSS-REFERENCE TO RELATED APPLICATIONS

This application is a continuation of International Application No. PCT/RU2016/000285, filed on May 12, 2016, the disclosure of which is hereby incorporated by reference in its entirety.

TECHNICAL FIELD

In general, the present disclosure relates to data encoding and decoding in communication systems. More specifically, the present disclosure relates to devices and methods for encoding and decoding data using polar codes. Moreover, the disclosure relates to a method for generating a compact specification of a polar code.

BACKGROUND

Reliable transmission of data over noisy communication channels requires some kind of error correction coding to be used. Polar codes were shown to achieve the Shannon capacity of many channels (see, E. Arikan, "Channel polarization: A method for constructing capacity achieving codes for symmetric binary-input memoryless channels," IEEE Trans. on Inf. Theory, vol. 55, no. 7, pp. 3051-3073, July 2009). However, the performance of polar codes with practical parameters is often unsatisfactory.

Recently, polar subcodes were shown to have higher minimum distance than classical polar codes, and provide substantially better performance under list, sequential and block sequential decoding (see, P. Trifonov and V. Miloslavskaya, "Polar subcodes," IEEE Journal on Selected Areas in Communications, 34(2):254-266, February 2016). However, the performance of polar subcodes still can be improved. Moreover, in the low SNR (signal-to-noise ratio) region a block sequential decoding algorithm may require a lot of iterations for near-ML (maximum likelihood) decoding.

Another problem arising in the practical implementation of polar subcodes is the complexity of their specification, i.e. defining these codes so that they can be executed by a processor. Typically, communication systems need to implement a number of codes with different parameters. The description of all these codes, i.e. their specification, has to be stored in a compact form both at the transmitter and at the receiver.

Generally, a $(n=2^m, k)$ polar subcode C over GF(2) is a set of vectors $c=zW A$, where W is a k×n matrix, $$A = \begin{pmatrix} 1 & 0 \\ 1 & 1 \end{pmatrix}^{\otimes m},$$

and $F^{\otimes m}$ denotes the m-times Kronecker product of the matrix F with itself. Classical polar codes are obtained by choosing the matrix W such that each column of W has at most a weight of 1 and each row has a weight of 1. Polar subcodes are obtained by choosing the matrix W such that the vectors c are also codewords of some parent code with sufficiently high minimum distance, i.e. $cH^T=0$, where H is a check matrix of the parent code. Extended BCH codes were shown to be good parent codes.

An equivalent way to define a polar subcode is to consider it as a set of vectors $c=uA$, where $uV^T=0$ and V is a (n−k)×n constraint matrix, such that $WV^T=0$. By employing Gaussian elimination, the matrix V can be transformed into a form such that at most one row ends in each column. Doing so, one obtains the following set of constraints for the input symbols $u_i$ of the polarizing transformation A: $u_{j_i} = \Sigma_{s<j_i: V_{is}=1} u_s$, $0 \le i < n-k$, wherein $j_i$ denotes the position of the last non-zero entry in the i-th row of the matrix V. The symbols $j_i$ are referred to as dynamic frozen symbols, which can be considered as a generalization of the concept of static frozen symbols used in the construction of classical polar codes. The standard way to construct a polar subcode is to construct the constraint matrix $V_0=HA^T$, where, as already mentioned above, H is the check matrix of a suitable parent code, and to introduce additional constraints $u_{j_i}=0$ (so-called static freezing constraints) for symbols with the highest error probability $P_{j_i}$ under the successive cancellation decoding for some specific communication channel. Hence, the matrix V can be expressed as:

$$V = \begin{pmatrix} V_0 \\ E \end{pmatrix},$$

wherein E is the matrix consisting of rows with weight 1.

The existing techniques for specifying polar codes essentially reduce to specifying the parameters of the channel, and a particular method for computing error probabilities $P_i$ so that one can re-construct the set $\mathcal{F}$ of frozen symbols $j_i$. The following three methods for solving this problem are known in the prior art:

Firstly, density evolution (see, I. Tal, A. Vardy, "How to construct polar codes," IEEE Transactions on Information Theory, 59(10):6562-6582, October 2013) is an optimal and precise method for computing the error probabilities $P_i$, $0 \le i < n$ with complexity $O(n\mu^2 \log \mu)$, where $\mu$ is of the order of several hundreds, which is impractical for online code construction.

Secondly, the Gaussian approximation method described in P. Trifonov, "Efficient design and decoding of polar codes," IEEE Transactions on Communications, 60(11): 3221-3227, November 2012, has a complexity O(n). However, this method requires evaluation of transcendental functions and, therefore, is very difficult to implement in hardware.

Thirdly, in the binary erasure channel (BEC) approximation method the $P_\phi$ are taken as erasure probabilities $P_\phi = Z_{m,\phi}$ under successive cancellation decoding in the case of transmission of a codeword of a polar code over the binary erasure channel with erasure probability $Z_{0,0}$, where $Z_{m,2\phi} = 2Z_{m-1,\phi} - (Z_{m-1,\phi})^2, Z_{m,2\phi+1} = (Z_{m-1,\phi})^2$ (see E. Arikan, "Channel polarization: A method for constructing capacity achieving codes for symmetric binary-input memoryless channels," IEEE Trans. on Inf. Theory, vol. 55, no. 7, pp. 3051-3073, July 2009). The complexity of this method is O(n), but it produces suboptimal codes for channels other than a BEC.

Thus, there is a need for improved devices and methods for encoding and decoding data using polar codes, in particular polar subcodes, as well as specifying these codes in an efficient way.

SUMMARY

It is an object of the disclosure to provide for improved devices and methods for encoding and decoding data using polar codes. Moreover, it is an object of the disclosure to provide for a method for generating a specification of a polar code in an efficient way.

The foregoing and other objects are achieved by the subject matter of the independent claims. Further implementation forms are apparent from the dependent claims, the description and the figures.

According to a first aspect the disclosure relates to an encoder for encoding data. The encoder comprises a processor configured to encode the data using a (n, k, d) parent polar code C into codewords $c_0^{n-1}=u_0^{n-1}A$ subject to the constraints $u_0^{n-1}V^T=0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself and wherein the constraint matrix V is defined by the following equation:

$$V = \begin{pmatrix} V_0 \\ V_1 & 0 \\ 0 & V_2 \\ E \end{pmatrix},$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1.

Encoding data by means of the encoder according to the first aspect of the disclosure allows using a larger number of freezing constraints during the early phases of the sequential/list decoding process. This, in turn, allows reducing the number of high probability paths in the code tree explored by the decoder, thereby reducing the average number of iterations performed and the probability of the decoder losing the correct path. Thus, encoding data by means of the encoder according to the first aspect of the disclosure provides a peter performance in the high SNR region and substantially reduces the coding complexity compared to encoders using conventional polar subcodes.

In a first possible implementation form of the encoder according to the first aspect as such, the first helper code $C_1$ defines a minimum distance $d_1$, which is greater than or equal to the minimum distance d of the parent polar code C.

In a second possible implementation form of the encoder according to the first aspect as such or the first implementation form thereof, the second helper code $C_2$ defines a minimum distance $d_2$, which is greater than or equal to half the minimum distance d of the parent polar code C.

In a third possible implementation form of the encoder according to the first aspect as such or the first or second implementation form thereof, the processor is configured to generate the constraint matrix $V_1$ of the first helper code $C_1$ and/or the constraint matrix $V_2$ of the second helper code $C_2$ recursively.

In a fourth possible implementation form of the encoder according to the third implementation form of the first aspect, the processor is configured to generate the constraint matrix $V_1$ of the first helper code $C_1$ and the constraint matrix $V_2$ of the second helper code $C_2$ by generating the constraint matrix $V_1$ of the first helper code $C_1$ in the same way as the constraint matrix V and by generating the constraint matrix $V_2$ of the second helper code $C_2$ in the same way as the constraint matrix V.

In a fifth possible implementation form of the encoder according to the first aspect as such or any one of the first to fourth implementation form thereof, the parent polar code C, the first helper code $C_1$ and/or the second helper code $C_2$ is an extended Bose-Chaudhuri-Hocquenghem (BCH) code.

In a sixth possible implementation form of the encoder according to the first aspect as such or any one of the first to fifth implementation form thereof, the encoder further comprises a memory comprising a specification of the parent polar code C, the first helper code $C_1$ and/or the second helper code $C_2$, wherein the specification is based on an approximation of the parent polar code C, the first helper code $C_1$ and/or the second helper code $C_2$ for a binary erasure channel (BEC).

In a seventh possible implementation form of the encoder according to the sixth implementation form of the first aspect, the specification of the parent polar code C, the first helper code $C_1$ and/or the second helper code $C_2$ is generated by the following steps: determining a first frozen set of the code; determining a second frozen set of an approximation of the code using the binary erasure channel (BEC); and storing the differences between the first frozen set and the second frozen set in the memory of the encoder.

According to a second aspect the disclosure relates to a method for encoding data, wherein the method comprises the step of encoding the data using a (n, k, d) parent polar code C into codewords $c_0^{n-1}=u_0^{n-1}A$ subject to the constraints $u_0^{n-1}V^T=0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself and wherein the constraint matrix V is defined by the following equation:

$$V = \begin{pmatrix} V_0 \\ V_1 & 0 \\ 0 & V_2 \\ E \end{pmatrix},$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1.

The method according to the second aspect of the disclosure can be performed by the encoder according to the first aspect of the disclosure. Further features of the method according to the second aspect of the disclosure result directly from the functionality of the encoder according to the first aspect of the disclosure and its different implementation forms.

According to a third aspect the disclosure relates to a decoder for decoding codewords, wherein the decoder comprises a processor configured to decode the codewords $c_0^{n-1}=u_0^{n-1}A$ using a (n, k, d) parent polar code C subject to the constraints $u_0^{n-1}V^T=0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself and wherein the constraint matrix V is defined by the following equation:

$$V = \begin{pmatrix} V_0 \\ V_1 & 0 \\ 0 & V_2 \\ E \end{pmatrix},$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1.

In a first possible implementation form of the decoder according to the third aspect, the first helper code $C_1$ defines a minimum distance $d_1$, which is greater than or equal to the minimum distance d of the parent polar code C.

In a second possible implementation form of the decoder according to the third aspect as such or the first implementation form thereof, the second helper code $C_2$ defines a minimum distance $d_2$, which is greater than or equal to half the minimum distance d of the parent polar code C.

In a third possible implementation form of the decoder according to the third aspect as such or the first or second implementation form thereof, the processor is configured to generate the constraint matrix $V_1$ of the first helper code $C_1$ and/or the constraint matrix $V_2$ of the second helper code $C_2$ recursively.

In a fourth possible implementation form of the decoder according to the third implementation form of the third aspect, the processor is configured to generate the constraint matrix $V_1$ of the first helper code $C_1$ and the constraint matrix $V_2$ of the second helper code $C_2$ by generating the constraint matrix $V_1$ of the first helper code $C_1$ in the same way as the constraint matrix V and by generating the constraint matrix $V_2$ of the second helper code $C_2$ in the same way as the constraint matrix V.

In a fifth possible implementation form of the decoder according to the third aspect as such or any one of the first to fourth implementation form thereof, the parent polar code C, the first helper code $C_1$ and/or the second helper code $C_2$ is an extended Bose-Chaudhuri-Hocquenghem (BCH) code.

In a sixth possible implementation form of the decoder according to the third aspect as such or any one of the first to fifth implementation form thereof, the decoder further comprises a memory comprising a specification of the parent polar code C, the first helper code $C_1$ and/or the second helper code $C_2$, wherein the specification is based on an approximation of the parent polar code C, the first helper code $C_1$ and/or the second helper code $C_2$ for a binary erasure channel (BEC).

In a seventh possible implementation form of the decoder according to the sixth implementation form of the third aspect, the specification of the parent polar code C, the first helper code $C_1$ and/or the second helper code $C_2$ is generated by the following steps: determining a first frozen set of the code; determining a second frozen set of an approximation of the code using the binary erasure channel (BEC); and storing the differences between the first frozen set and the second frozen set in the memory of the encoder.

According to a fourth aspect the disclosure relates to a method for decoding codewords, wherein the method comprises the step of decoding the codewords $c_0^{n-1} = u_0^{n-1} A$ using a (n, k, d) parent polar code C subject to the constraints $u_0^{n-1} V^T = 0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself and wherein the constraint matrix V is defined by the following equation:

$$V = \begin{pmatrix} V_0 \\ V_1 & 0 \\ 0 & V_2 \\ E \end{pmatrix},$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1.

The method according to the fourth aspect of the disclosure can be performed by the decoder according to the third aspect of the disclosure. Further features of the method according to the fourth aspect of the disclosure result directly from the functionality of the decoder according to the third aspect of the disclosure and its different implementation forms.

According to a fifth aspect the disclosure relates to a method of providing a compact specification of a polar code, wherein the method comprises the steps of: determining a first frozen set of the polar code; determining a second frozen set of an approximation of the polar code using the binary erasure channel (BEC); and determining the differences between the first frozen set and the second frozen set.

According to a sixth aspect the disclosure relates to a computer program comprising program code for performing the method according to the second aspect of the disclosure, the method according to the fourth aspect of the disclosure or according to the fifth aspect of the disclosure, when executed on a computer.

The disclosure can be implemented in hardware and/or software.

BRIEF DESCRIPTION OF THE DRAWINGS

Further embodiments of the disclosure will be described with respect to the following figures, wherein:

FIG. 7 shows a table for comparing the efficiency of the compact code specification implemented in embodiments of the disclosures with conventional code specifications.

In the figures, identical reference signs will be used for identical or functionally equivalent features.

DETAILED DESCRIPTION OF EMBODIMENTS

In the following description, reference is made to the accompanying drawings, which form part of the disclosure, and in which are shown, by way of illustration, specific aspects in which the present disclosure may be placed. It will be appreciated that the disclosure may be placed in other aspects and that structural or logical changes may be made without departing from the scope of the disclosure. The following detailed description, therefore, is not to be taken in a limiting sense, as the scope of the disclosure is defined by the appended claims.

For instance, it will be appreciated that a disclosure in connection with a described method will generally also hold true for a corresponding device or system configured to perform the method and vice versa. For example, if a specific method step is described, a corresponding device may include a unit to perform the described method step, even if such unit is not explicitly described or illustrated in the figures.

Moreover, in the following detailed description as well as in the claims, embodiments with functional blocks or processing units are described, which are connected with each other or exchange signals. It will be appreciated that the disclosure also covers embodiments which include additional functional blocks or processing units that are arranged between the functional blocks or processing units of the embodiments described below.

Finally, it is understood that the features of the various exemplary aspects described herein may be combined with each other, unless specifically noted otherwise.

Figure 1:
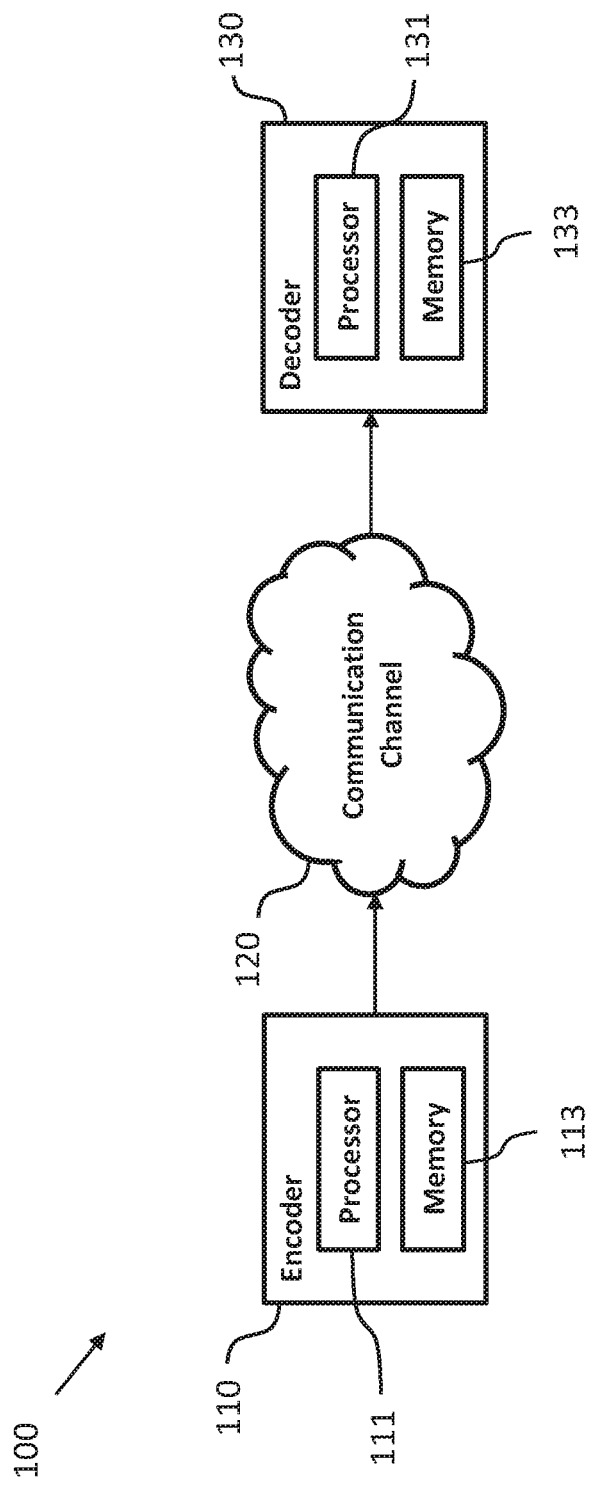
FIG. 1 shows a schematic diagram of a communication system comprising an encoder according to an embodiment and a decoder according to an embodiment.

FIG. 1 shows a schematic diagram illustrating a communication system 100 comprising an encoder 110 and a decoder 130, which can communicate via a communication channel 120.

The encoder 110 comprises a processor 111 and a memory 113 and is configured to encode data. Likewise, the decoder 130 comprises a processor 131 and a memory 133 and is configured to decode data, in particular data encoded by the encoder 110. The encoder 110 and/or the decoder 130 can be implemented as part of a communication device, such as a mobile phone or a base station of a cellular communication network.

In order to reduce the decoding error probability and complexity of sequential decoding, embodiments of the disclosure provide recursive polar subcodes. The constraint matrix for a recursive polar subcode is given by $$V = \begin{pmatrix} V_0 \\ V_1 & 0 \\ 0 & V_2 \\ E \end{pmatrix},$$

where $V_1$ and $V_2$ are the constraint matrices of some helper $(n/2, k_i, d_i)$ codes $C_1$ and $C_2$.

Thus, in an embodiment the processor 111 of the encoder 110 is configured to encode the data using a (n, k, d) parent polar code C into codewords $c_0^{n-1}=u_0^{n-1}A$ subject to the constraints $u_0^{n-1}V^T=0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself. (n, k, d) defines the length n of the parent polar code C, the number of information bits k, i.e the length of the data, and the minimum distance d of the parent polar code C. The constraint matrix V is defined by the following equation:

$$V = \begin{pmatrix} V_0 \\ V_1 & 0 \\ 0 & V_2 \\ E \end{pmatrix},$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1. In an embodiment, the first helper code $C_1$ and/or the second helper code $C_2$ are subcodes of a Reed-Muller code of sufficiently small order. The rows of weight 1 of the matrix E define static freezing constraints, which, in an embodiment, are imposed onto bit subchannels of low capacity by the polarizing transformation.

Likewise, in an embodiment the processor 131 of the decoder 130 is configured to decode the codewords $c_0^{n-1}=u_0^{n-1}A$ using a (n, k, d) parent polar code C subject to the constraints $u_0^{n-1}V^T=0$, wherein $u_0^{n-1}$ denotes the data, wherein $$A = \begin{pmatrix} 1 & 0 \\ 1 & 1 \end{pmatrix}^{\otimes m},$$

wherein $F^{\otimes m}$ denotes the m-times Kronecker product of the matrix F with itself and wherein the constraint matrix V is defined by the following equation:

$$V = \begin{pmatrix} V_0 \\ V_1 & 0 \\ 0 & V_2 \\ E \end{pmatrix}$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1.

In an embodiment, the parameters of the helper codes are selected in such a way that they have sufficiently high minimum distance, i.e $$d_1 \geq d, d_2 \geq \frac{d}{2}.$$

The constraint matrices $V_1$ and $V_2$ of the helper codes can be constructed recursively in the same way as the constraint matrix $V_0$ of the parent code. Thus, embodiments of the disclosure allow introducing more freezing constraints to the early phases of the sequential/list decoding process. This allows reducing the number of high probability paths in the code tree explored by the decoder, reducing thus the average number of iterations performed, and the probability of the decoder losing the correct path.

In an embodiment, the code can be constructed in the follow way:
1. Construct dynamic freezing constraints for a parent (n, k', d) extended BCH code;
2. Construct dynamic freezing constraints for the helper $(n_i, k_i, d_i)$ extended BCH codes;
3. Combine the constraint matrices of parent and helper codes to obtain r'×n matrix V', and let $$F' = \left\{ i_j = \max_{i:V_{ji} \neq 0} i \,\middle|\, 0 \leq j < r' \right\};$$

4. Compute the error probability in bit subchannels $W_m^{(i)}$ $(y_0^{n-1}, u_0^{i-1} | u_\phi)$, $0 \leq \phi < 2^m$ using the techniques described, for example, in I. Tal, A. Vardy, "How to construct polar codes", IEEE Transactions on Information Theory, 59(10):6562-6582, October 2013 or P. Trifonov, "Efficient design and decoding of polar codes", IEEE Transactions on Communications, 60(11):3221-3227, November 2012; and
5. Find n–r'–k indices $\phi \notin F'$ with the highest error probability, and define additional constraints $u_\phi = 0$.

In an embodiment, the parent polar code C, the first helper code $C_1$ and/or the second helper code $C_2$ is an extended Bose-Chaudhuri-Hocquenghem (BCH) code. The check matrix of an extended BCH parent or helper code is given by $$H = \begin{pmatrix} x_0^0 & x_1^0 & \cdots & x_{n-1}^0 \\ x_0^1 & x_1^1 & \cdots & x_{n-1}^1 \\ \vdots & \vdots & \ddots & \vdots \\ x_0^{d-2} & x_1^{d-2} & \cdots & x_{n-1}^{d-2} \end{pmatrix},$$

where $x_i$ are distinct values of $GF(2^m)$. Each row of this matrix results in a number of freezing constraints of the following form:

$$uA(x_0^t, \ldots, x_{n-1}^t)T = 0, \quad 0 \leq t \leq d-2 \quad (1)$$

It is possible to show that after combining with additional constraints $u_i = 0$ corresponding to bit subchannels with high error probability most of the equations defined by (1) become trivial (i.e. $u_i = 0$).

The rows of check matrices corresponding to the non-trivial constraints $u_{i_j} = \sum_{s=0}^{i_j-1} u_s V_{js}$ are referred to as active rows. In an embodiment, only the active rows (i.e. integers t) of the constraint matrix are specified.

In an embodiment, the remaining static freezing constraints are specified in the following manner. A parameter $Z_{0,0}$ defining the binary erasure channel (BEC) is specified and only the symmetric differences between the set of static frozen symbol indices (i.e. integers $i:u_i = 0$) of the polar code constructed for the BEC and the considered polar subcode are stored as part of the specification. As known to the person skilled in the art, the symmetric difference of two sets A and D is their union excluding their intersection, i.e.

$$A \Delta B = (A \cup B) \setminus (A \cap B).$$

Thus, the present disclosure provides a method of generating a compact specification of a polar code, wherein the method comprises the steps of: determining a first frozen set of the polar code; determining a second frozen set of an approximation of the polar code using the binary erasure channel (BEC); and determining the differences between the first frozen set and the second frozen set. Such compact specifications can be stored in the memory 113 of the encoder 110 and/or the memory 133 of the decoder 130.

Let $\mathcal{F}$ be the set of trivial frozen symbol indices for a code of length $n = 2^m$, $|\mathcal{F}| = f$. Consider a BEC with erasure probability $Z_{0,0} = p$. Denote $B(p)$ as the vector of indices i of subchannels sorted by their erasure probabilities $Z_{m,i}$ in descending order. Let $B(p)_0^{f-1}$ be the set of frozen symbol indices for a (n, n–f) polar code C' optimized for the BEC. In an embodiment, the size of the difference of the set of indices of frozen symbols between C' and the target code is minimized. Thereafter, $B\mathcal{F} = B(p^*)_0^{f-1}$ can be computed, where $$(p^*, f^*) = \arg\min_{p \in [0,1], 0 \leq f < n} \left| \mathcal{F} \Delta B(p)_0^{f-1} \right|.$$

Hence, according to an embodiment the code can be specified by a tuple $S(m, \mathcal{F}) = (m, |\mathcal{F}|, p^*, |B\mathcal{F}|, \mathcal{F} \Delta B_F)$, where m is the logarithm to the base 2 of the code length, $|\mathcal{F}|$ is number of static frozen symbols, and $p^*$ is the optimal erasure probability.

In an embodiment, this approach is implemented recursively. In an embodiment, the set $\mathcal{F}$ is split into two subsets $H_L(m, \mathcal{F}) = \{i \in \mathcal{F} \mid i < 2^{m-1}\}$ and $H_R(m, \mathcal{F}) = \{i - 2^{m-1} \mid i \in \mathcal{F}, i \geq 2^{m-1}\}$. In an embodiment, the compact specification procedure S(m,F) is recursively applied to obtain a recursive specification in the following form:

$$S^*(m, F) =$$
$$\begin{cases} S(m, F), & |S(m, F)| \leq |S^*(m-1, H_L(m, F))| + |S^*(m-1, H_R(, F))| \\ S^*(m-1, H_L(m, F)) \cdot S^*(m-1, H_R(m, F)), & \text{otherwise} \end{cases},$$

where |S| is the length in bytes of the specification and $S_1 . S_2$ denotes a concatenation of the two specifications $S_i$ and $S_2$.

In the following an example will be described, which illustrate several aspects of the disclosure.

Figure 2:
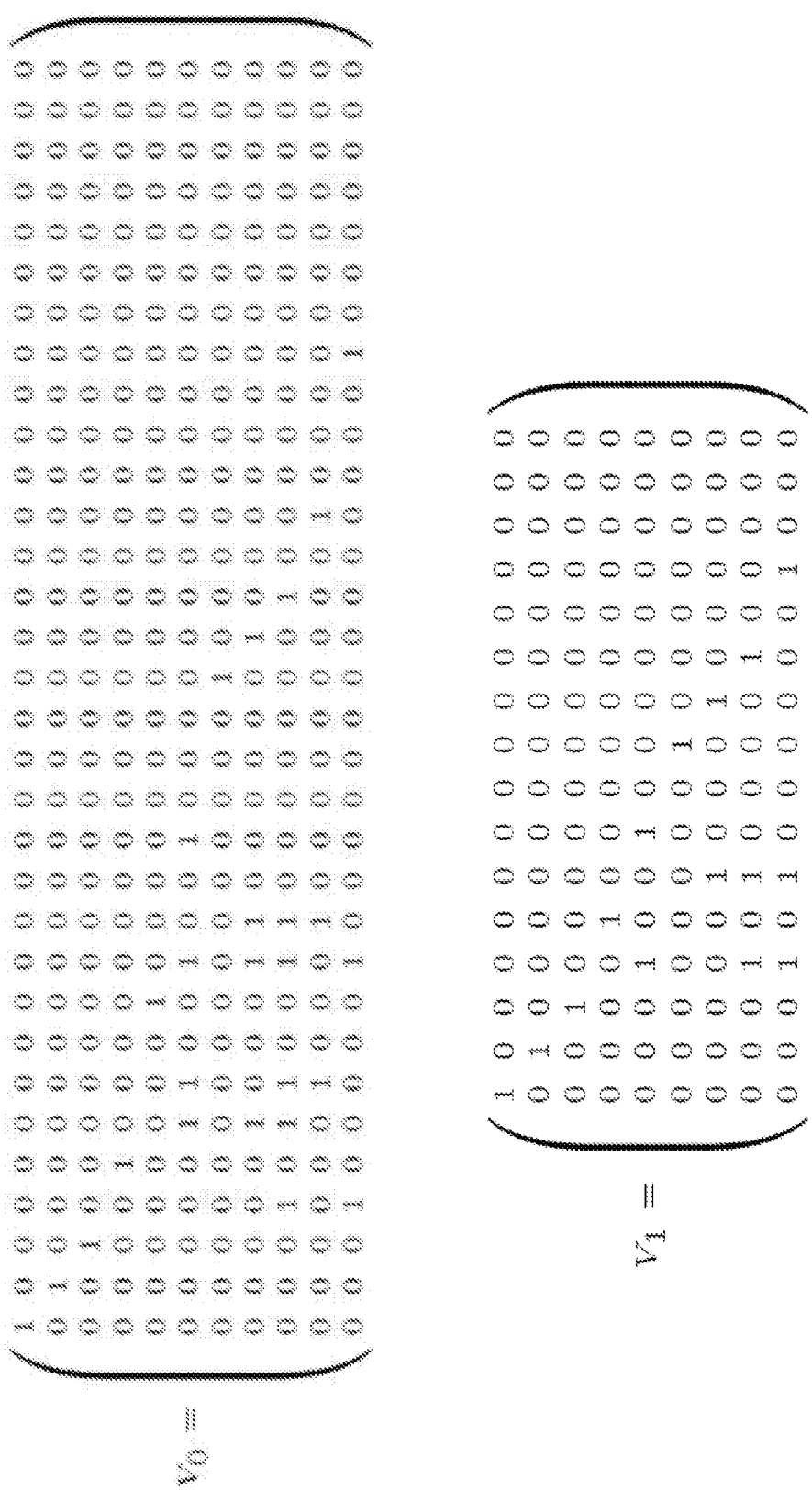
FIG. 2 shows two exemplary constraint matrices for generating a polar code according to an embodiment.
Figure 3:
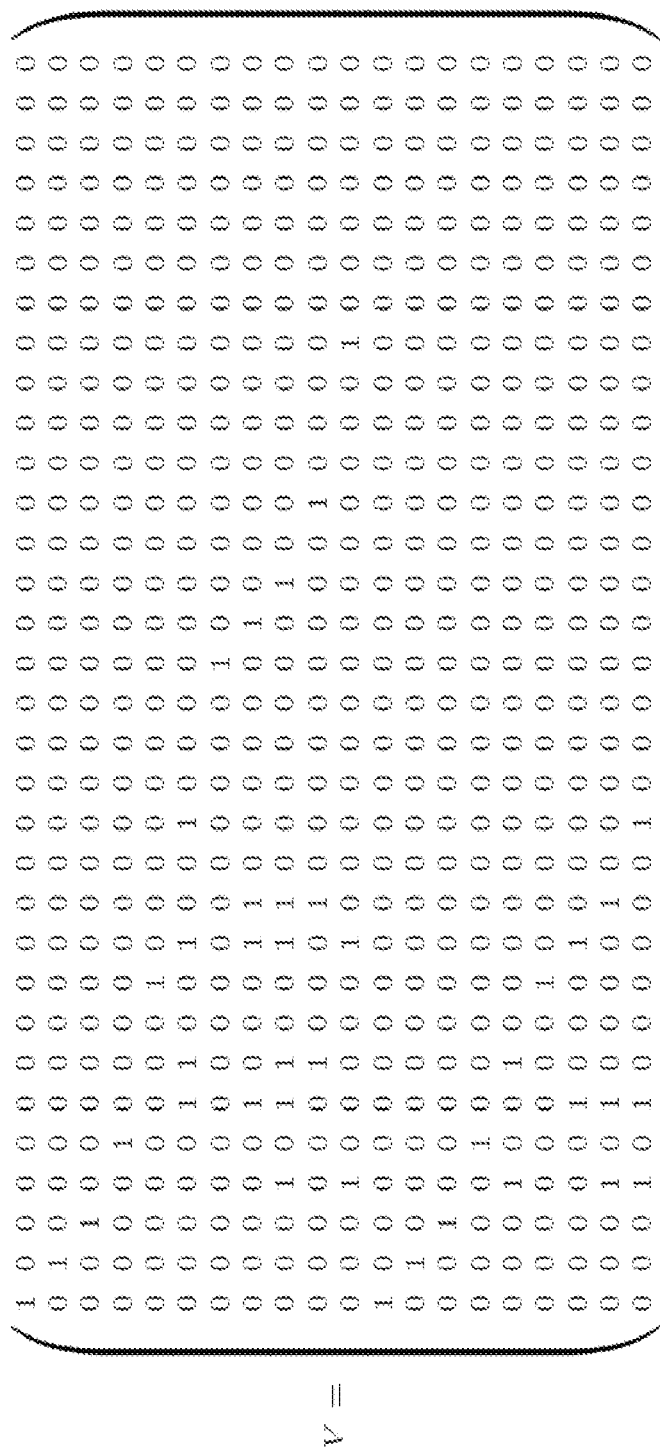
FIG. 3 shows an exemplary constraint matrix for generating a polar code according to an embodiment.
Figure 4:
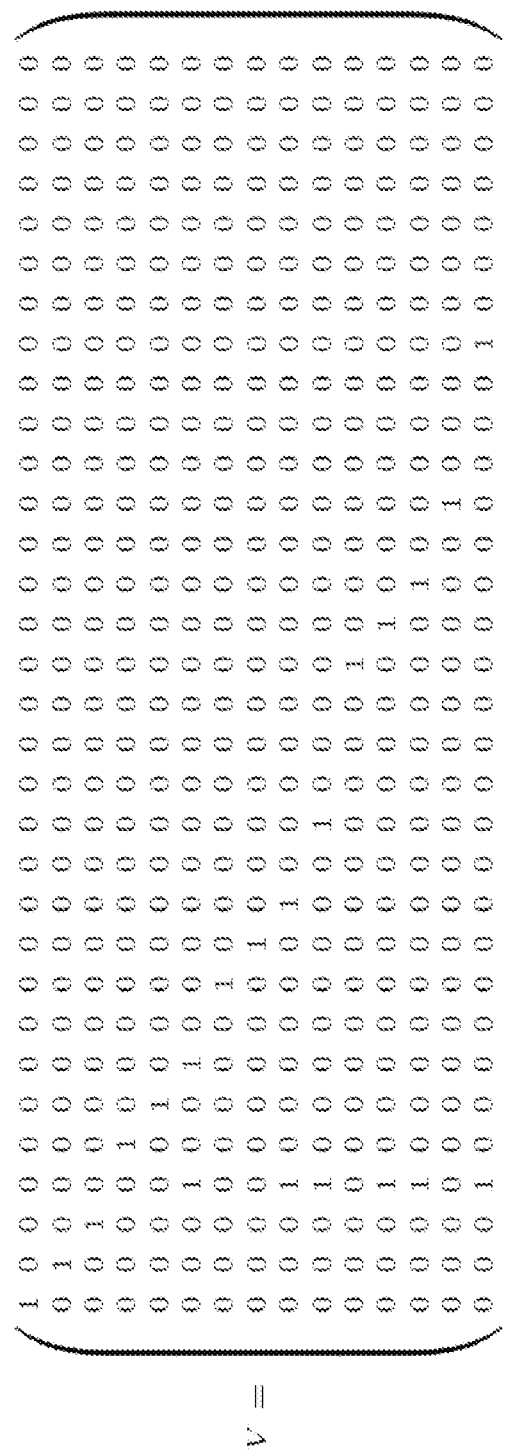
FIG. 4 shows an exemplary constraint matrix for generating a polar code according to an embodiment.

Consider construction of a (32,17,6) recursive polar subcode. A constraint matrix of the (32,21,6) e-BCH parent code is given by the matrix $V_0$ shown in FIG. 2. A constraint matrix of the (16,7,6) e-BCH code is given by the matrix $V_1$ shown also in FIG. 2. Combining these matrices, one obtains the matrix V shown in FIG. 3. Eliminating linearly dependent rows, one obtains the equivalent constraint matrix V shown in FIG. 4. Since this matrix has already 32–17=15 rows, there is no need to impose any additional constraints, so it can be taken as a constraint matrix of the (32,17,6) recursive polar subcode.

Consider a (32, 16)-polar code with the following set of frozen symbols F:

$F=\{0, 16, 17, 18, 19, 20, 21, 22, 23, 24, 25, 26, 28, 29, 30, 31\}$

In an embodiment, the frozen set F can be approximated by the frozen set for the binary erasure channel (BEC) with erasure probabilities of 0.005, 0.01, 0.015, . . . , 0.995. In an embodiment, the optimal approximated set is $B_F=\{0\}$, $p^*=0.005$, $f^*=1$. The non-recursive compact specification is defined as follows:

$S(5, F)=(m,|F|,p^*,|B_F|,|F\backslash B_F|,F\backslash B_F,B_F\backslash F)=(5, 16, 0.005, 1, 15, \{16, 17, 18, 19, 20, 21, 22, 23, 24, 25, 26, 28, 29, 30, 31\}, \{ \})$ This exemplary specification contains 20 numbers. After the algorithm finishes building this specification, it tries to split the frozen set into two parts and approximate them separately. In the considered case the partitioning is $H_L=\{0\}, H_R=\{0,1,2,3,4,5,6,7,8,9,10,12,13,14,15\}$ The set $H_L$ is approximated by $B_{H_L}=B_F$, $p^*_{H_L}=p^*$, $f^*_{H_L}=f^*$. The set $H_R$ is approximated by $B_{H_R}=\{0,1,2,3,4,5,6,7,8,9,10,11,12,13,14,15\},$
$f^*_{H_R}=16, p^*_{H_R}=0.005, |H_R\backslash B_{H_R}|=0, |B_{H_R}\backslash H_R|=1,$
$B_{H_R}\backslash H_R=\{11\}$ Hence, the code can be specified by giving the following numbers:

4, 0.005, 1, 1, 0
4, 0.005, 15, 16, 0
11

This recursive specification requires just 11 numbers, which is much less than is required for the above presented non-recursive specification.

Figure 5:
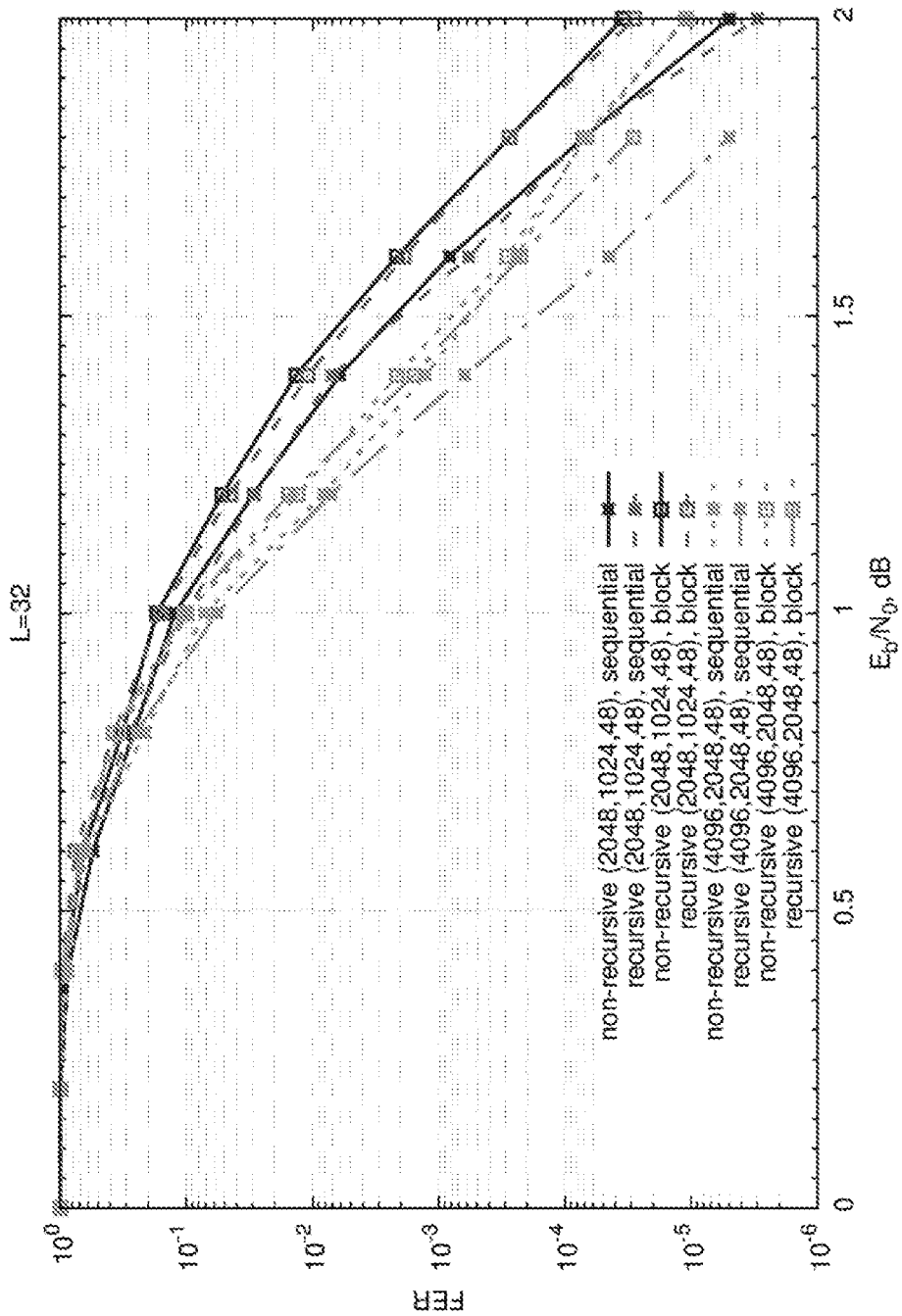
FIG. 5 shows a diagram for comparing the performance of recursive polar subcodes and conventional non-recursive polar subcodes in the context of sequential and block sequential decoding.
Figure 6:
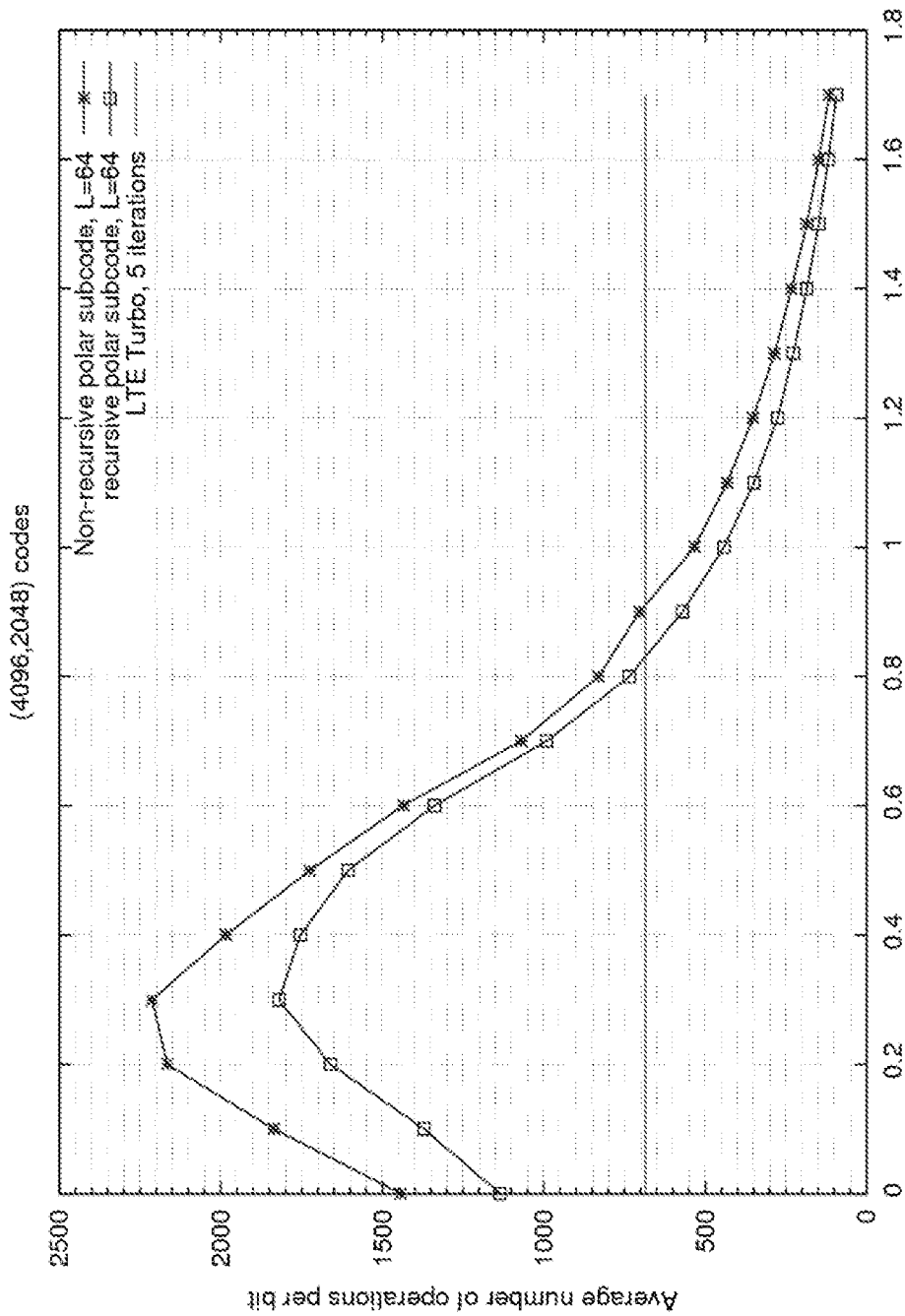
FIG. 6 shows a diagram for comparing the complexity of recursive polar subcodes and conventional non-recursive polar subcodes in the context of sequential decoding.

FIG. 5 illustrates the performance of polar subcodes with recursive and non-recursive construction. It can be seen that recursive polar subcodes provide substantially better performance. FIG. 6 illustrates the average number of operations performed by the block sequential decoding algorithm while decoding recursive and non-recursive polar subcodes. It can be seen that the decoding complexity for the case of recursive polar subcodes is approximately 22% lower compared to the case of non-recursive ones.

The efficiency of the embodiments for compact code specification is illustrated by the table shown in FIG. 7.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art will readily recognize that there are numerous applications of the disclosure beyond those described herein. While the present disclosure has been described with reference to one or more particular embodiments, those skilled in the art will recognize that many changes may be made thereto without departing from the scope of the present disclosure. It is therefore to be understood that within the scope of the appended claims and their equivalents, the disclosure may be practiced otherwise than as specifically described herein.

What is claimed is:

1. An encoder for encoding data, wherein the encoder comprises:
   a processor configured to:
      obtain a data sequence; and
      encode the data sequence using a (n, k, d) parent polar code C into codewords $c_0^{n-1}$, wherein a (n, k, d) denotes a length n of the parent polar code C, a number of information bits k, and a minimum distance d of the parent polar code C; and
   a transmitter configured to:
      output the codewords $c_0^{n-1}$ over a communication channel;
   wherein $c_0^{n-1}=u_0^{n-1}A$ subject to constraint $u_0^{n-1}V^T=0$, wherein $u_0^{n-1}$ denotes the data sequence, wherein $$A = \begin{pmatrix} 1 & 0 \\ 1 & 1 \end{pmatrix}^{\otimes m},$$

wherein $F^{\otimes m}$ denotes an m-times Kronecker product of matrix F with itself, and wherein the constraint matrix V is defined by the following equation:

$$V = \begin{pmatrix} V_0 \\ V_1 & 0 \\ 0 & V_2 \\ E \end{pmatrix}$$

wherein $V_0$ denotes the constraint matrix of the parent polar code, $V_1$ denotes the constraint matrix of a first helper code $C_1$, $V_2$ denotes the constraint matrix of a second helper code $C_2$, and E denotes a matrix consisting of rows of weight 1.

2. The encoder of claim 1, wherein
   the first helper code $C_1$ defines a minimum distance $d_1$, which is greater than or equal to a minimum distance d of the parent polar code C, and
   the second helper code $C_2$ defines a minimum distance $d_2$, which is greater than or equal to half the minimum distance d of the parent polar code C.

3. The encoder of claim 1, wherein the processor is configured to generate one or more of the constraint matrix $V_1$ of the first helper code $C_1$ and the constraint matrix $V_2$ of the second helper code $C_2$ recursively in a same manner as the constraint matrix $V_0$.

4. The encoder of claim 1, wherein one or more of the parent polar code C, the first helper code $C_1$, and the second helper code $C_2$ is an extended Bose-Chaudhuri-Hocquenghem (BCH) code.

5. The encoder of claim 4, further comprising:
a memory storing one or more of: a specification of the parent polar code C, the first helper code $C_1$, and the second helper code $C_2$, wherein the specification is based on an approximation of the parent polar code C, the first helper code $C_1$ and the second helper code $C_2$ for a binary erasure channel (BEC).

6. The encoder of claim 5, wherein the specification of the parent polar code C, the first helper code $C_1$ and the second helper code $C_2$ is generated by the following steps:
determining a first frozen set of the parent polar code C, the first helper code $C_1$ and the second helper code $C_2$ according to check matrices of the parent polar code C, the first helper code $C_1$, and the second helper code $C_2$;
determining a second frozen set of an approximation of the parent polar code C, the first helper code $C_1$, and the second helper code $C_2$ using the BEC; and
determining and storing the symmetric differences between the first frozen set and the second frozen set in the memory of the encoder as part of the specification of the parent polar code C, the first helper code $C_1$, and the second helper code $C_2$.

7. A method for encoding data, the method comprising:
obtaining, by a processor, a data sequence;
encoding, by the processor, the data using a (n, k, d) parent polar code C into codewords $c_0^{n-1}$, wherein a (n, k, d) denotes a length n of the parent polar code C, a number of information bits k, and a minimum distance d of the parent polar code C;
outputting, by the processor, the codewords $c_0^{n-1}$ to a transmitter for transmission over a communication channel;
wherein $c_0^{n-1} = u_0^{n-1} A$ is subject to a constraint $u_0^{n-1} V^T = 0$, wherein $u_0^{n-1}$ denotes the data sequence, wherein $$A = \begin{pmatrix} 1 & 0 \\ 1 & 1 \end{pmatrix}^{\otimes m},$$

wherein $F^{\otimes m}$ denotes an m-times Kronecker product of matrix F with itself, and wherein the constraint matrix V is defined by the following equation:

$$V = \begin{pmatrix} V_0 & \\ V_1 & 0 \\ 0 & V_2 \\ E & \end{pmatrix}$$

wherein $V_0$ denotes the constraint matrix of the parent polar code, $V_1$ denotes the constraint matrix of a first helper code $C_1$, $V_2$ denotes the constraint matrix of a second helper code $C_2$, and E denotes a matrix consisting of rows of weight 1.

8. A decoder for decoding codewords, wherein the decoder comprises:
a receiver configured to:
receive codewords $c_0^{n-1}$ over a communication channel, wherein $c_0^{n-1} = u_0^{n-1} A$; and
a processor configured to:
decode the codewords $c_0^{n-1}$ using a (n, k, d) parent polar code C subject to a constraint $u_0^{n-1} V^T = 0$ into a data sequence, wherein a (n, k, d) denotes a length n of the parent polar code C, a number of information bits k, and a minimum distance d of the parent polar code C;
wherein $u_0^{n-1}$ denotes the data sequence, wherein $$A = \begin{pmatrix} 1 & 0 \\ 1 & 1 \end{pmatrix}^{\otimes m},$$

wherein $F^{\otimes m}$ denotes an m-times Kronecker product of matrix F with itself, and wherein the constraint matrix V is defined by the following equation:

$$V = \begin{pmatrix} V_0 & \\ V_1 & 0 \\ 0 & V_2 \\ E & \end{pmatrix}$$

wherein $V_0$ denotes the constraint matrix of the parent polar code, $V_1$ denotes the constraint matrix of a first helper code $C_1$, $V_2$ denotes the constraint matrix of a second helper code $C_2$, and E denotes a matrix consisting of rows of weight 1.

9. The decoder of claim 8, wherein
the first helper code $C_1$ defines a minimum distance $d_1$, which is greater than or equal to a minimum distance d of the parent polar code C, and
the second helper code $C_2$ defines a minimum distance $d_2$, which is greater than or equal to half the minimum distance d of the parent polar code C.

10. The decoder of claim 8, wherein the processor is configured to generate one or more of the constraint matrix $V_1$ of the first helper code $C_1$ and the constraint matrix $V_2$ of the second helper code $C_2$ recursively in a same manner as the constraint matrix $V_0$.

11. The decoder of claim 8, wherein one or more of the parent polar code C, the first helper code $C_1$, and the second helper code $C_2$ is an extended Bose-Chaudhuri-Hocquenghem (BCH) code.

12. The decoder of claim 11, further comprising:
a memory storing a specification of one or more of the parent polar code C, the first helper code $C_1$, and the second helper code $C_2$, wherein the specification is based on an approximation of the parent polar code C, the first helper code $C_1$ and the second helper code $C_2$ for a binary erasure channel (BEC).

13. The decoder of claim 12, wherein the specification of one or more of the parent polar code C, the first helper code $C_1$, and the second helper code $C_2$ is generated by the following steps:
determining a first frozen set of the parent polar code C, the first helper code $C_1$, and the second helper code $C_2$ according to check matrices of the parent polar code C, the first helper code $C_1$, and the second helper code $C_2$;
determining a second frozen set of an approximation of the parent polar code C, the first helper code $C_1$, and the second helper code $C_2$ using the BEC; and
storing the differences between the first frozen set and the second frozen set in the memory of the decoder as part of the specification of the parent polar code C, the first helper code $C_1$ and the second helper code $C_2$.

14. A method for decoding codewords, the method comprising:
  obtaining, by a processor, codewords $c_0^{n-1}$ received by a receiver over a communication channel, wherein $c_0^{n-1} = u_0^{n-1} A$; and
  decoding, by the processor, the codewords $c_0^{n-1} = u_0^{n-1} A$ using a (n, k, d) parent polar code C subject to a constraint $u_0^{n-1} V^T = 0$ into a data sequence, wherein a (n, k, d) denotes a length n of the parent polar code C, a number of information bits k, and a minimum distance d of the parent polar code C;
  wherein $u_0^{n-1}$ denotes the data sequence, wherein $$A = \begin{pmatrix} 1 & 0 \\ 1 & 1 \end{pmatrix}^{\otimes m},$$

wherein $F^{\otimes m}$ denotes an m-times Kronecker product of matrix F with itself, and wherein the constraint matrix V is defined by the following equation:

$$V = \begin{pmatrix} V_0 \\ V_1 & 0 \\ 0 & V_2 \\ E \end{pmatrix}$$

wherein $V_0$ denotes the constraint matrix of the parent polar code, $V_1$ denotes the constraint matrix of a first helper code $C_1$, $V_2$ denotes the constraint matrix of a second helper code $C_2$ and E denotes a matrix consisting of rows of weight 1.

15. A computer program comprising program code for performing the method of claim 7 when executed on a computer.

16. A computer program comprising program code for performing the method of claim 14 when executed on a computer.

* * * * *